(12) United States Patent
Feldman (10) Patent No.: US 9,231,525 B2
(45) Date of Patent: Jan. 5, 2016

(54) COMPENSATING A TWO STAGE AMPLIFIER

(71) Applicant: Google Inc., Mountain View, CA (US)

(72) Inventor: Arnold Feldman, San Francisco, CA (US)

(73) Assignee: Google Inc., Mountain View, CA (US)

( * ) Notice: Subject to any disclaimer, the term of this patent is extended or adjusted under 35 U.S.C. 154(b) by 77 days.

(21) Appl. No.: 14/192,964

(22) Filed: Feb. 28, 2014

(65) Prior Publication Data

US 2015/0249430 A1    Sep. 3, 2015

(51) Int. Cl.
*H03F 3/45*     (2006.01)
*H03F 1/02*     (2006.01)
*G05F 1/575*    (2006.01)

(52) U.S. Cl.
CPC ............ *H03F 1/0205* (2013.01); *G05F 1/575* (2013.01); *H03F 3/45071* (2013.01); *H03F 2200/471* (2013.01); *H03F 2203/45034* (2013.01)

(58) Field of Classification Search
CPC ........................................................ H03F 3/45
USPC ................... 330/252, 260, 261, 310, 150, 98
See application file for complete search history.

(56) References Cited

U.S. PATENT DOCUMENTS

| | | | |
|---|---|---|---|
| 6,300,749 B1 | 10/2001 | Castelli et al. | |
| 6,603,292 B1 | 8/2003 | Schouten et al. | |
| 7,248,117 B1 | 7/2007 | Li et al. | |
| 7,589,507 B2 | 9/2009 | Mandal | |
| 7,692,489 B2 | 4/2010 | Kelly et al. | |
| 7,986,188 B2 * | 7/2011 | Fujiwara | 330/292 |
| 2012/0038332 A1* | 2/2012 | Lin | 323/277 |
| 2012/0043454 A1* | 2/2012 | Sakuragi | 250/206 |

FOREIGN PATENT DOCUMENTS

CN            101847028 A    9/2010

OTHER PUBLICATIONS

International Search Report, issued Apr. 9, 2015 in corresponding International Application No. PCT/US2014/068295.

\* cited by examiner

*Primary Examiner* — Henry Choe
(74) *Attorney, Agent, or Firm* — Morris & Kamlay LLP (57) ABSTRACT

Systems and techniques are disclosed for configuring a circuit containing a two-stage amplifier including a first stage containing at least a differential amplifier, a second stage containing at least a transistor, and a sensing circuit configured to provide a gate voltage to a compensation component. The compensation component may be configured to connect the first stage and the second stage and to generate a lead-lag compensation. The compensation component may contain a compensation capacitor and a variable compensation resistive component in series connection with the compensation capacitor.

22 Claims, 7 Drawing Sheets

COMPENSATING A TWO STAGE AMPLIFIER

BACKGROUND

A two-stage amplifier, such as an on-chip voltage regulator, is conventionally compensated by setting a dominant pole at the output of the first stage. The dominant pole may be created using either Miller compensation or lead-lag compensation. In a conventional two-stage amplifier with varying load currents, the compensation capacitor can result in an adjustable pole in the frequency response. The pole is adjusted for maximum stability in the compensation system; either Miller or lead-lag is suitable. In either compensation scheme, the non-dominant pole is directly related to the transconductance of the second stage of the amplifier, which requires a minimum current in the second stage amplifier in order to guarantee a finite transconductance.

With varying load currents in the second stage, the minimum current is overhead of the amplifier in all cases and, thus, the power dissipation may be higher than necessary. Increased power dissipation may cause reduced battery life and/or excess heat dissipation.

BRIEF SUMMARY

According to implementations of the disclosed subject matter, a circuit may contain a two-stage amplifier containing a first stage amplifier with at least a differential amplifier and a second stage amplifier containing at least a transistor (e.g., a PMOS transistor). The second stage amplifier may contain a bipolar junction transistor or a field-effect transistor such as a metal-oxide semiconductor field-effect transistor and a junction gate field-effect transistor. A compensation component may be connected to the first stage and the second stage and may generate a lead-lag compensation. The compensation component may contain a compensation capacitor and a variable compensation resistive component in series connection with the compensation capacitor. The circuit may be configured to output an output voltage such that the resistance value of the variable compensation resistive component is determined based at least on the output voltage and/or the load current. The output voltage may be maintained such that it is substantially fixed for a range of load currents, and the variable compensation resistive component may contain a resistor and a first transistor in parallel with the transistor. The first transistor may be biased in the triode region. The circuit may generate a first voltage based on the load current and a second voltage based on the first voltage, via a mechanism such as a current mirror or a current mirror and one or more other components such as a transistor, or the like. The resistance value of the variable compensation resistive component may be based on or proportional to the second voltage. The variable compensation resistive component may comprise a first transistor in parallel with a resistor, the first transistor configured to have a gate voltage substantially equal to or proportional to the second voltage.

Systems and techniques according to the present disclosure enable adjusting a variable compensation resistive component with a minimal fixed current in the second stage to reduce power consumption. Additional features, advantages, and implementations of the disclosed subject matter may be set forth or apparent from consideration of the following detailed description, drawings, and claims. Moreover, it is to be understood that both the foregoing summary and the following detailed description include examples and are intended to provide further explanation without limiting the scope of the claims.

BRIEF DESCRIPTION OF THE DRAWINGS

The accompanying drawings, which are included to provide a further understanding of the disclosed subject matter, are incorporated in and constitute a part of this specification. The drawings also illustrate implementations of the disclosed subject matter and together with the detailed description serve to explain the principles of implementations of the disclosed subject matter. No attempt is made to show structural details in more detail than may be necessary for a fundamental understanding of the disclosed subject matter and various ways in which it may be practiced.

DETAILED DESCRIPTION

According to techniques disclosed herein, a circuit may contain a variable compensation resistive component. The variable compensation resistive component may be adjusted to maintain a stable output voltage for a range of load currents.

Figure 3:
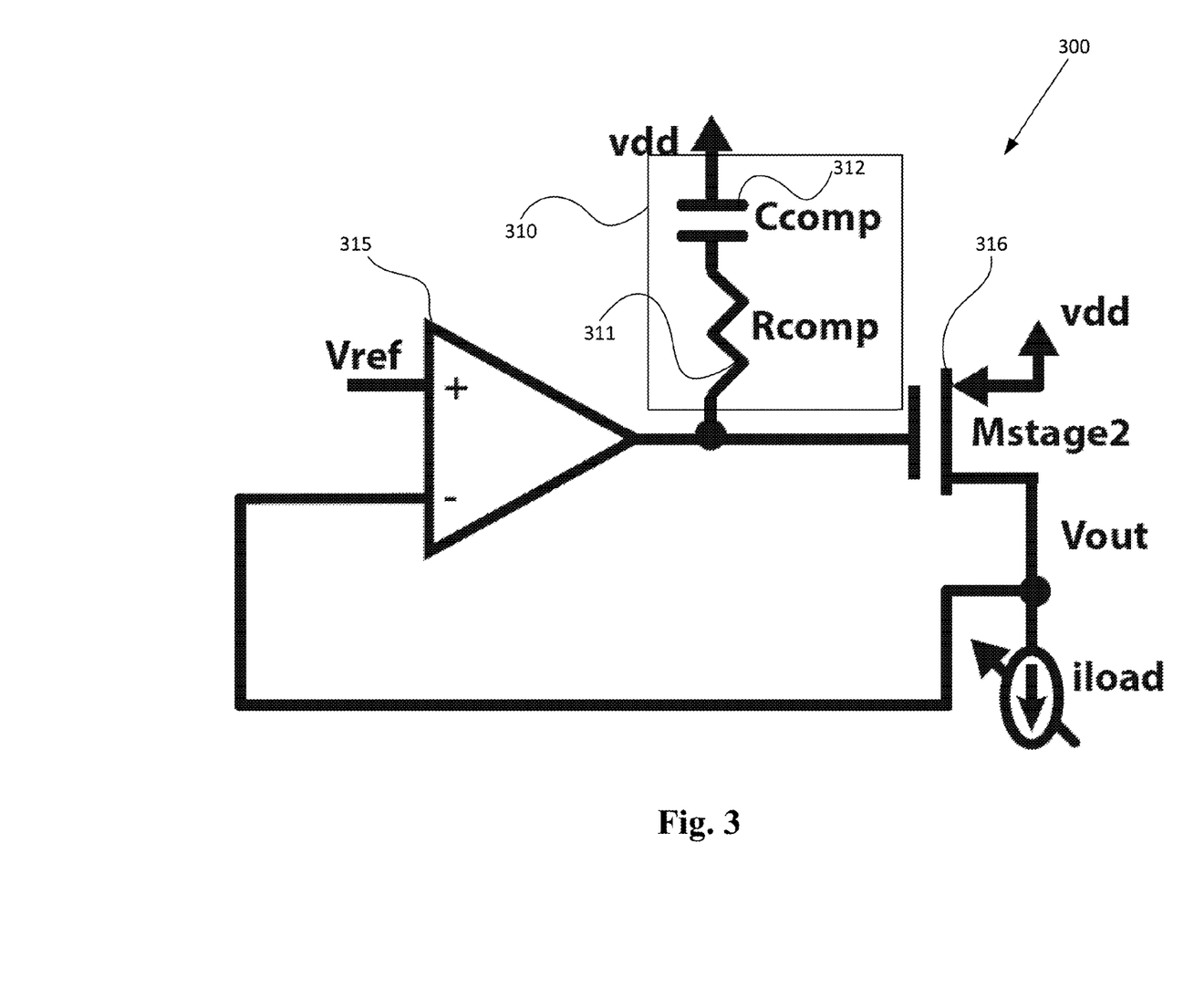
FIG. 3 shows an example voltage regulator with a lead-lag compensation scheme, according to an implementation of the disclosed subject matter.

A two-stage amplifier such as a linear voltage regulator may work over widely varying load currents. For example, the load current may vary between when an electronic device is in connection with the two-stage amplifier and when there is no device in connection with the two-stage amplifier. The two-stage amplifier may be compensated according to the presently disclosed subject matter using a lead-lag network as shown in FIG. 3. A lead-lag compensator may contain one or more components in a control system that improve an undesirable frequency response in a feedback and control system. As shown in FIG. 3, the voltage regulator 300 contains a compensation component 310 and a two-stage amplifier including a first stage 315 and a second stage 316. The compensation component 310 may contain a compensation capacitive component 312 and a compensation resistive component 311. The zero in the frequency response due to 311 and 312 generally cancels the non-dominant pole at the regulator output which moves with the load current.

Figure 4:
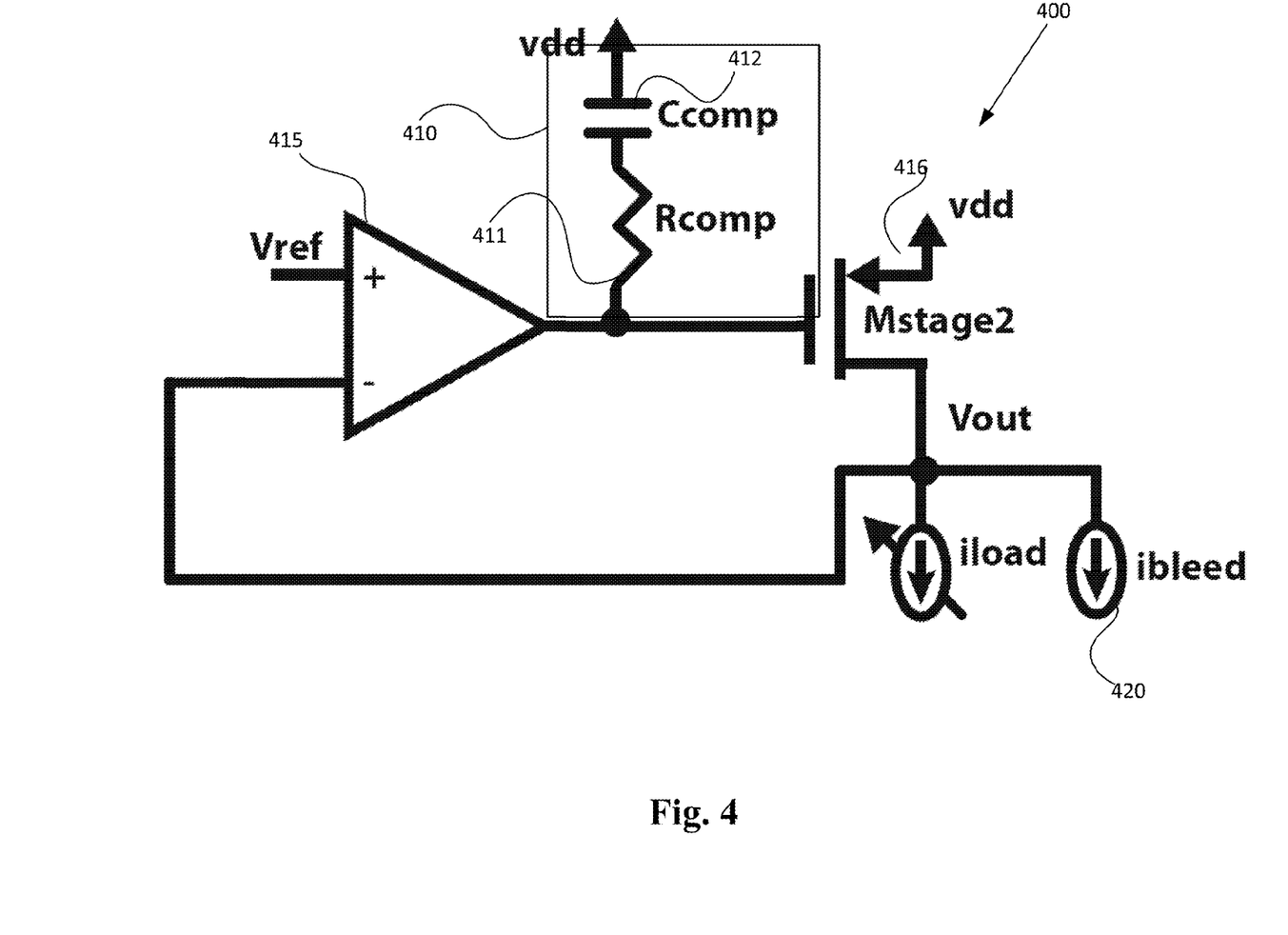
FIG. 4 shows another example voltage regulator with a lead-lag compensation scheme, according to an implementation of the disclosed subject matter.

As shown in FIG. 4, a voltage regulator 400 as disclosed herein may contain a compensation component 410 and a two-stage amplifier including a first stage 415 and a second stage 416. A fixed, minimum current 420 may be used to guarantee a minimum transconductance of the second stage to ensure stability (e.g., maintain a finite non-dominant pole). However the fixed current may result in overhead power consumption such that at least a portion of the power is not utilized by a load connected to the voltage regulator 400.

Figure 5:
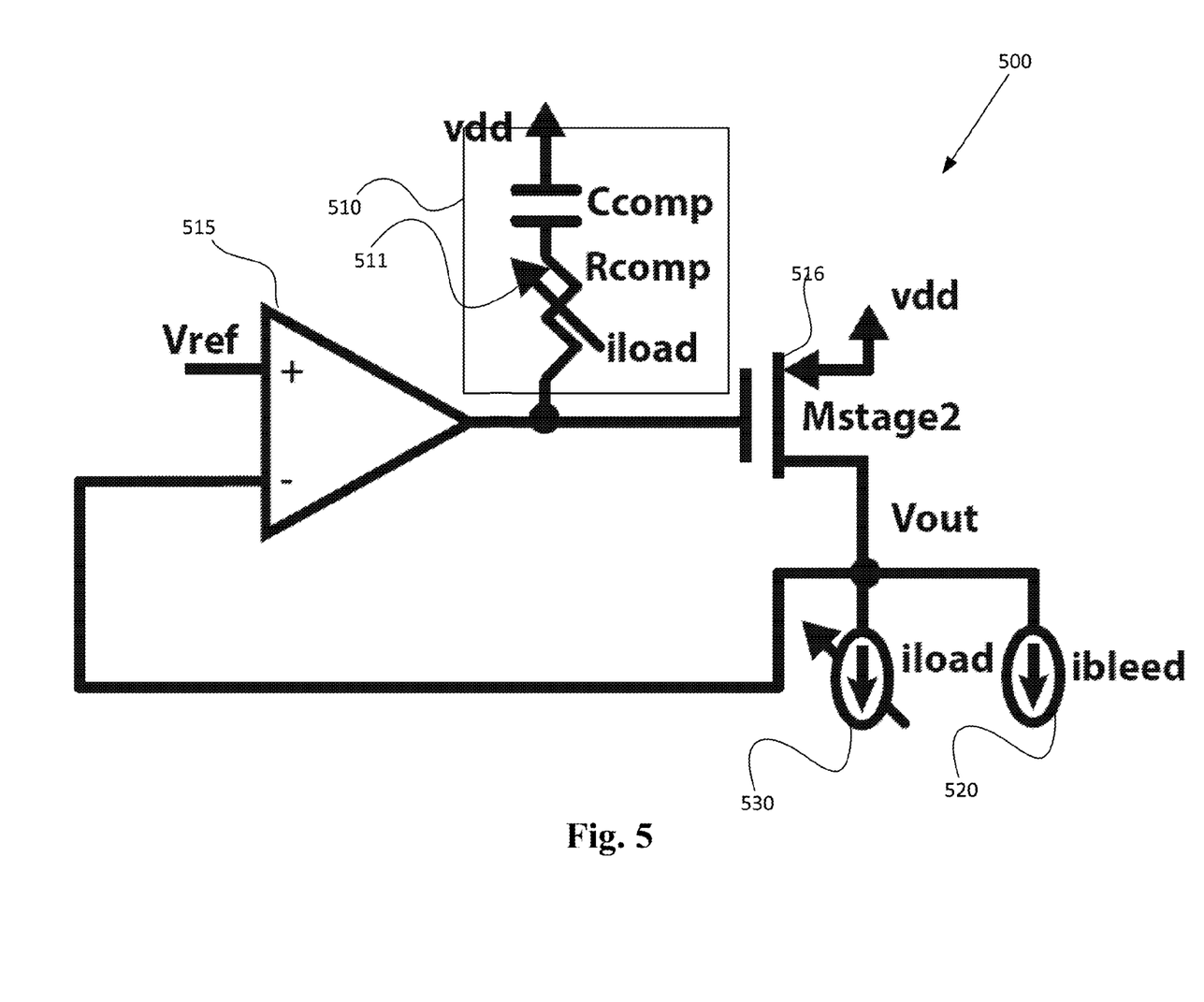
FIG. 5 shows an example voltage regulator with a variable resistor in the lead-lag compensation component, according to an implementation of the disclosed subject matter.

According to implementations of the subject matter disclosed herein, the frequency response zero in the compensation scheme may track the non-dominant pole location by sensing the load current, and may then adjust the resistance of a resistive compensation component of a lead-lag network. The sensing may be done via a sensing circuit that is configured to provide a voltage for a first transistor that is part of the resistive component of the compensation component. Accordingly, the resistance value of the resistive portion of the compensation component may be modified to maintain stability in the voltage reference. The stable voltage reference may be maintained while minimizing power consumption. As shown in FIG. 5, the voltage regulator 500 contains a two-stage amplifier including a first stage 515 and a second stage 516. A fixed, minimum overhead current 520 may be used to set a minimum load transconductance to ensure stability (e.g., maintain a finite non-dominant pole). Additionally, the voltage regulator 500 may contain a compensation component 510 that includes a resistive component 511, which is based on a voltage corresponding to the load current. The load current corresponds to the amount of current drawn by a component (e.g., device, appliance, circuit, etc.) connected to the voltage regulator 500. Here, tracking the load current 530 may correspond to changing the resistive value of the first transistor based on the load current 530. Essentially, the tracking may result in a variable compensation resistive component to modify its resistance value such that a stable output voltage reference is maintained.

Figure 6:
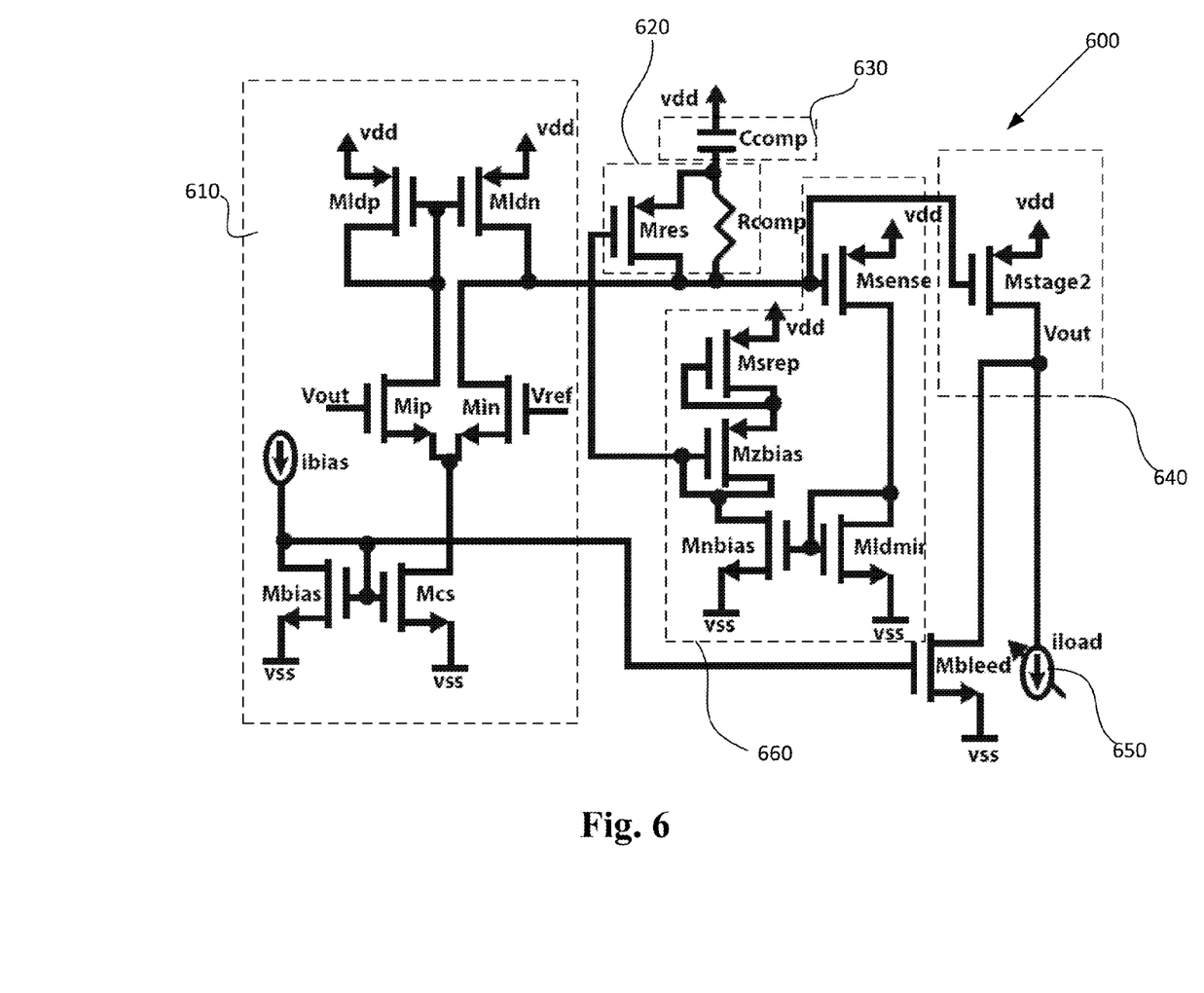
FIG. 6 shows an example load current sensing network according to an implementation of the disclosed subject matter.

According to an implementation of the disclosed subject matter, a voltage regulator 600 contains a first stage including at least a differential amplifier 610 and a second stage including at least a transistor 640. A differential amplifier may be a DC-coupled high-gain electronic voltage amplifier with a differential input and may contain one or more outputs. In this case, the non-inverting input to the differential amplifier is a reference voltage and the inverting input is connected to the output of the system resulting in negative feedback. The reference voltage may be substantially fixed for a range of load currents. Substantially fixed may correspond to a reference voltage that does not deviate by more than 1% within a given time period (e.g., within a minute). The voltage regulator 600 also contains a second stage including at least an amplifier 640 that contains a transistor (e.g., a p-type metal-oxide semiconductor (PMOS) transistor). The second stage transistor may be configured to experience a change in voltage differential based on a change in the combined overhead current and load current. The voltage differential may correspond to the difference in voltage between the gate ($v_{g\text{-}Mstage2}$) and source ($v_{s\text{-}Mstage2}$) at a transistor Mstage2 in the second stage. The gate voltage $v_g$ (AC or DC voltage) may be provided to a sensing circuit 660 such that the sensing circuit 660 provides a gate voltage to a variable component (e.g., a transistor) of the resistive component 620. The resistive component 620 may contain a non-variable component such as a resistor Rcomp and a variable transistor such as transistor Mres such that a change in the gate voltage for Mres results in a varied resistance value for the resistive component 620. The transistor Mres may be biased in the triode region. It will be understood that although the examples provided include MOSFETs, the techniques disclosed herein may be implemented via any applicable components. The gate voltage provided by the sensing circuit 660 may be determined based on the gate voltage of transistor Msense that has a source voltage vdd and a gate coupled with the gate of a transistor Mstage2 in the second amplifier 640. The transistor Mstage2 may be any applicable transistor such as a bi-polar junction transistor, a metal-oxide semiconductor field-effect transistor, a junction gate field-effect transistor or any other field-effect transistor, or the like. The voltage regulator 600 contains a compensation component that is configured to be connected between the first stage and the second stage amplifiers to provide a stable output voltage reference. Here, the lead-lag compensation scheme may stabilize the amplifier to avoid oscillation and maintain adequate phase and gain margin thereby providing a stable output voltage. The compensation component may contain a compensation capacitor 630 as well as a variable compensation resistive component 620 in series connection with the compensation capacitor.

The variable compensation resistive component may vary its resistance based on the load current. During operation of the circuit, a low overhead current may be maintained and, based on the low overhead current, the system may require frequency response stabilization. As disclosed here, the frequency response stabilization may be facilitated at least by the variable compensation resistive component. As the overhead current is maintained at a low value, the resulting power dissipation for the circuit is reduced in comparison to a circuit where the overhead current is not maintained at a low value and/or where the load current is not tracked. The variable compensation resistive component may vary its resistance value via MOS transistor technology. A MOS transistor, Msense, may be added to the two-stage amplifier to sense the load current while another MOS transistor, Mres, is added to the first stage. As disclosed herein, a sensing network may track the variation in the load current and may include a MOS network (e.g., current mirror and biasing network) to ensure proper tracking of the variation in transconductance of the second stage due to the variation in load current. The load current may cause a voltage differential (i.e., $V_{gs\text{-}Mstage2}$ at an amplifier in the second stage 640 in FIG. 6 such that the gate voltage provided to the variable resistor by the sensing circuit 660 is based on the gate voltage at the second stage amplifier 640.

According to an implementation of the disclosed subject matter, as shown in FIG. 6, a sensing circuit 660 may be used to provide a gate voltage to a variable component (e.g., a transistor) of the resistive component 620. As shown in FIG. 6, the gate voltage from the transistor Mstage 2 in the second stage 640 may be provided to the gate at a sensing transistor Msense. The current through the transistor Msense is proportional to the load current (i.e., as, at 640, both the source voltage and drain voltage are held constant, thus requiring the gate voltage to be modified based on the load current, the gate voltage being connected to the gate for Msense). The current through Msense dictates the gate voltage provided to the transistor in the resistive component 620. This may be implemented by propagating the current from Msense through a current mirror, as shown via the transistors Mnbias and Mldmir, such that the current at the transistor Mnbias is proportional to the current Mldmir (which is equal to or similar to the current through Msense). Here, the proportionality may be a difference or ratio due to width-to-length ratios (k factor), gate-source ratios, drain-source ratios, or the like. Accordingly, the drain voltage of the transistor Mnbias, based on the current through Msense, would be provided to the gate of the transistor in the resistive component 620. The drain voltage provided to the gate of the transistor in 620 may be based on the original gate voltage provided to Msense from Mstage2 such that the gate voltage provided to the transistor in 620 is proportional to the original gate voltage less a $v_{sg\text{-}Msrep}$ as shown in 660. Msrep may be a gate-drain connected transistor for which the gate-drain terminal is tied to source for another transistor, Mzbias, another gate-drain connected transistor. As shown, the drain for Mzbias may be connected to the drain for the current mirror transistor Mnbias such that the drain for Mzbias and the drain for Mnbias correspond to the voltage for the gate for transistor Mres. Moreover, $v_{g\text{-}Mres}$ (which equals $v_{g\text{-}Mz\_bias}$ since they are physically tied) is a $v_{sg}$ below $v_{g\text{-}Msense}$, which equals $v_{g\text{-}Mstage2}$ since they are tied. $v_{g\text{-}Mres}$ may be a $v_{sg}$ below $v_{g\text{-}Msense}$ to ensure that Mres is biased in the triode region (DC bias).

Figure 7:
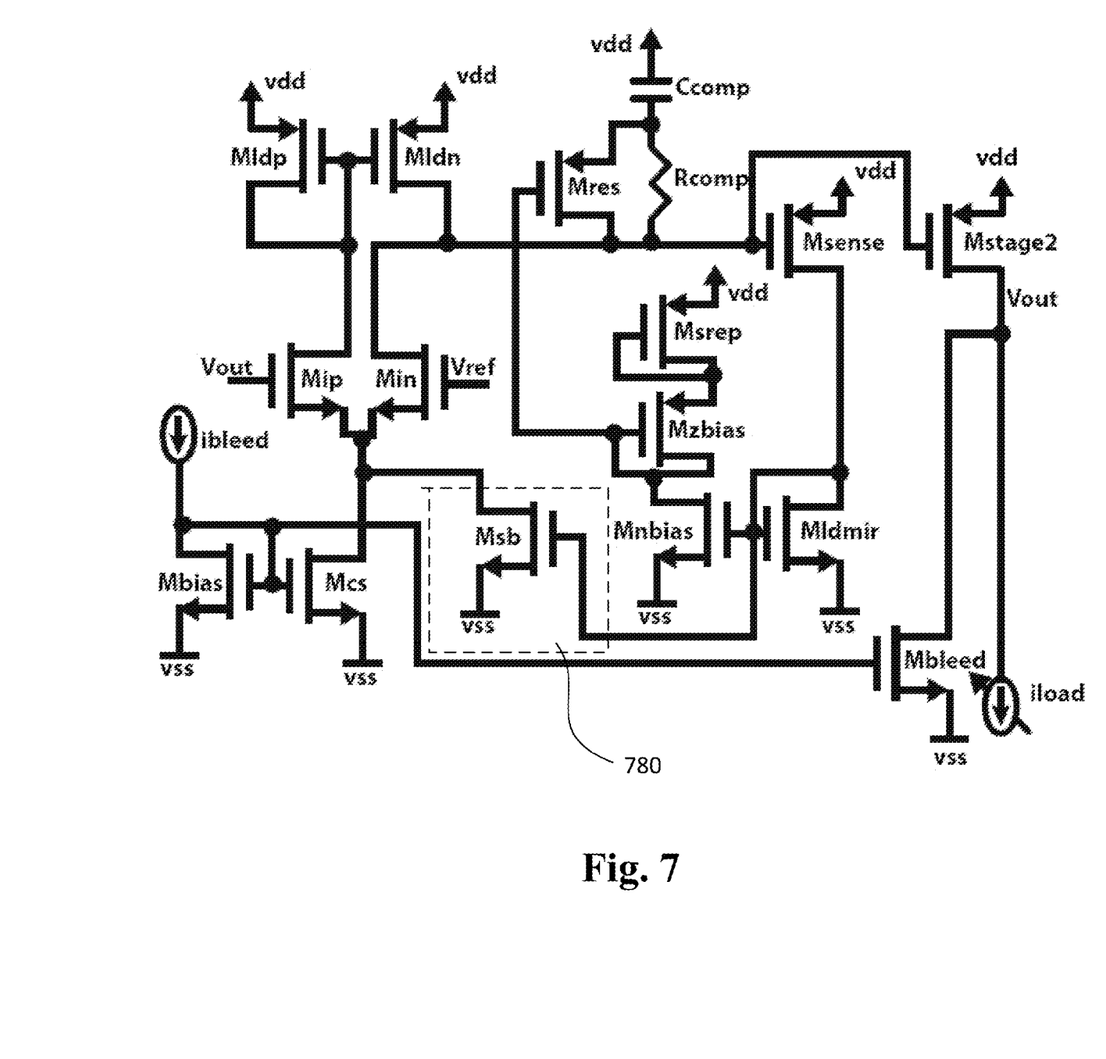
FIG. 7 shows an example first stage self-bias network, according implementation of the disclosed subject matter.

According to an implementation of the disclosed subject matter, if a load current varies widely, a transistor Msb, as shown in FIG. 7, may be added to maintain enhanced stability. This transistor may adjust the bias current and therefore the transconductance in the first stage (Mip and Min) of the amplifier based on the load current. The bandwidth of the regulator and its dominant pole frequency may be directly related to the transconductance of Mip and Min while the non-dominant pole is proportional to the transconductance of Mstage2. Therefore, adjusting the bandwidth may further allow the circuit to maintain regulator stability over varying load currents by maintaining the appropriate relationship between dominant and non-dominant pole frequencies. According to this implementation, an overhead that is a fixed percentage of the varying iload is present and may help under the important low load current condition.

Figure 1:
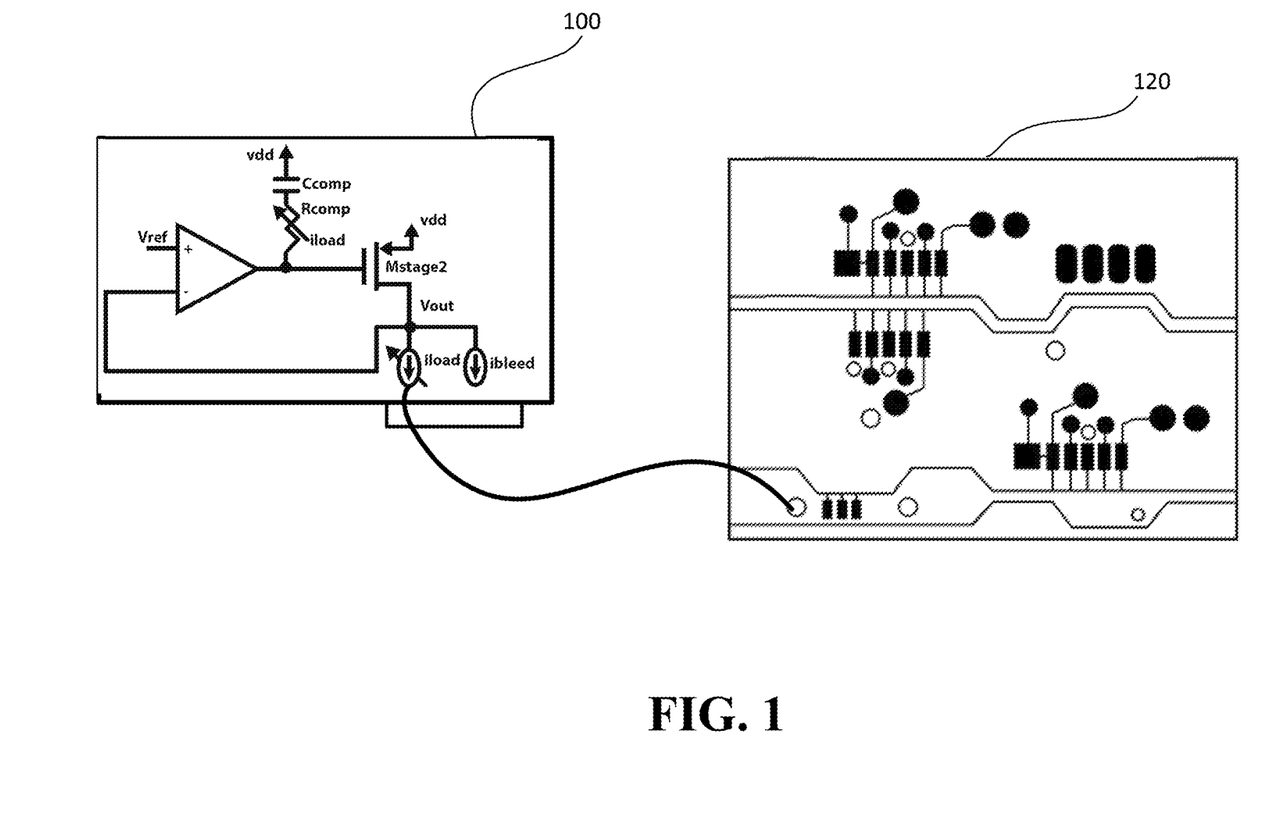
FIG. 1 shows a circuit in connection with a second circuit according to an implementation of the disclosed subject matter.
Figure 2A:
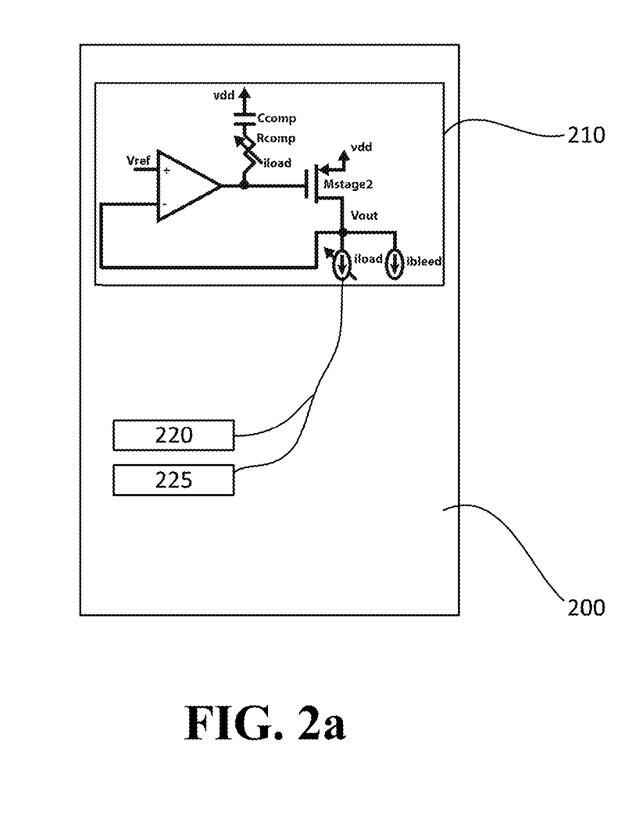
FIG. 2a shows a circuit contained within a computer tower, according to an implementation of the disclosed subject matter.
Figure 2B:
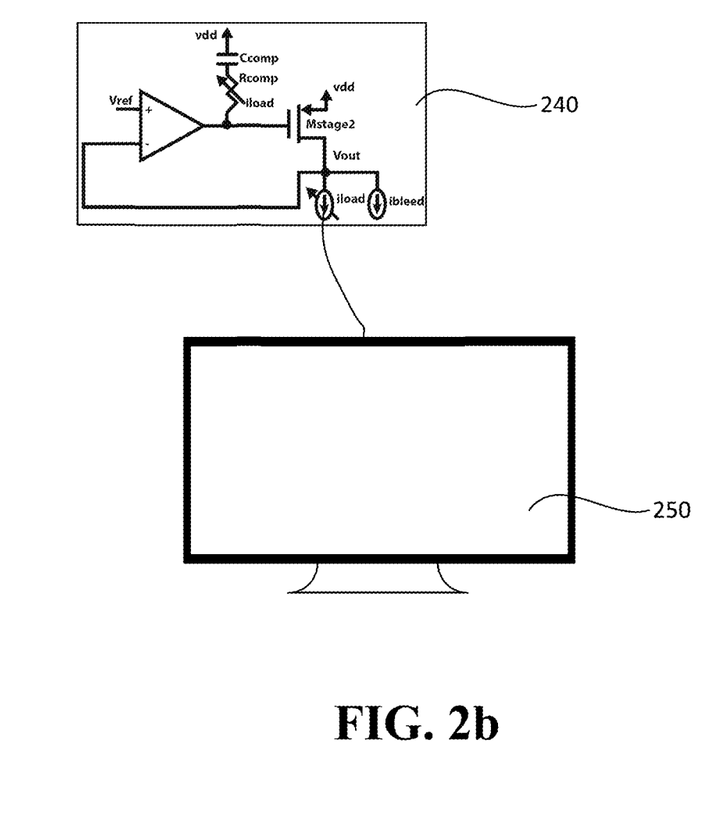
FIG. 2b shows a circuit in connection with a consumer product, according to an implementation of the disclosed subject matter.

Implementations of the presently disclosed subject matter may be implemented in and used with a variety of components and network architectures. The circuit disclosed herein may be used in circuit, computer and/or network components such as those shown in FIGS. 1 and 2. As shown in FIG. 1, a circuit 100 configured based on the techniques disclosed herein may be connected to a second circuit 120 that requires power to operate. The second circuit 120 may be connected to circuit 100 via any applicable technique such as a solder connection, fuse, wire, link, or the like. The circuit 100 may provide power to the second circuit 120 while maintaining stability within circuit 100.

As shown in FIG. 2a a computer tower 200 may contain a circuit 210 configured based on the techniques disclosed herein. The circuit 210 may be connected to one or more components housed within the computer tower 200 such as component 220 and 225. The circuit 210 may receive power from a power source and may distribute the power to the components 220 and 225 while maintaining stability within the circuit 210 via at least a variable resistive component. Similarly, a circuit 240, configure according to techniques disclosed herein, may be connected to a consumer product such as a television 250. The circuit 240 may receive power from a power source and may distribute the power to the television 250 while maintaining stability within the circuit 240 via at least a variable resistive component The foregoing description, for purpose of explanation, has been described with reference to specific implementations. However, the illustrative discussions above are not intended to be exhaustive or to limit implementations of the disclosed subject matter to the precise forms disclosed. Many modifications and variations are possible in view of the above teachings. The implementations were chosen and described in order to explain the principles of implementations of the disclosed subject matter and their practical applications, to thereby enable others skilled in the art to utilize those implementations as well as various implementations with various modifications as may be suited to the particular use contemplated.

The invention claimed is:

1. A circuit comprising:
   a two-stage amplifier comprising:
      a first stage comprising a differential amplifier; and
      a second stage comprising a transistor;
      a sensing circuit, to detect a first voltage and a second voltage, where the second voltage is detected based on the first voltage;
   a compensator in signal communication with the first stage and with the second stage, the compensator comprising:
      a compensation capacitor; and
      a variable compensation resistive component, the value of which is determined based on the detected second voltage, in series with the compensation capacitor,
   wherein the compensator generates a lead-lag compensation.

2. The circuit of claim 1, configured to output a reference voltage, wherein the reference voltage is substantially fixed for a range of load currents.

3. The circuit of claim 2, wherein the resistance value of the variable compensation resistive component is determined based on the output voltage.

4. The circuit of claim 2, wherein the resistance value of the variable compensation resistive component is determined based on the load current.

5. The circuit of claim 3, further configured to:
   detect the first voltage based on at least one selected from the group consisting of: the output voltage and the load current.

6. The circuit of claim 5, wherein the variable compensation resistive component comprises a first transistor in parallel with a resistor, the first transistor configured to have a gate voltage proportional to the second voltage.

7. The circuit of claim 1, wherein the resistive value for the variable compensation resistive component is configured to maintain a stable output voltage.

8. The circuit of claim 1, wherein variable compensation resistive component comprises:
   a resistor; and
   a first transistor in parallel with the resistor.

9. The circuit of claim 8, wherein the first transistor is biased in the triode region.

10. The circuit of claim 1, wherein the transistor comprises a bi-polar junction transistor.

11. The circuit of claim 1, wherein the transistor comprises a field-effect transistor is at least one selected from the group consisting of: a metal-oxide semiconductor field-effect transistor and a junction gate field-effect transistor.

12. A system comprising:
   a two-stage amplifier comprising:
      a first stage comprising at least a differential amplifier; and
      a second stage comprising a transistor;
      a sensing circuit, to detect a first voltage and a second voltage, where the second voltage is detected based on the first voltage;
   a compensator in signal communication with the first stage and with the second stage, the compensator comprising:
      a compensation capacitor; and
      a variable compensation resistive component, the value of which is determined based on the detected second voltage, in series with the compensation capacitor;
   wherein the compensator generates a lead-lag compensation.

13. The system of claim 12, configured to output a reference voltage, wherein the reference voltage is substantially fixed for a range of load currents.

14. The system of claim 13, wherein the resistance value of the variable compensation resistive component is determined based on the output voltage.

15. The system of claim 13, wherein the resistance value of the variable compensation resistive component is determined based on the load current.

16. The system of claim 14, further configured to:
    detect the first voltage based on at least one selected from the group consisting of: the output voltage and the load current.

17. The system of claim 16, wherein the variable compensation resistive component comprises a first transistor in parallel with a resistor, the first transistor configured to have a gate voltage proportional to the second voltage.

18. The system of claim 12, wherein the resistive value for the variable compensation resistive component is configured to maintain a stable output voltage.

19. The system of claim 12, wherein variable compensation resistive component comprises:
    a resistor; and
    a first transistor in parallel with the resistor.

20. The system of claim 19, wherein the first transistor is biased in the triode region.

21. The system of claim 12, wherein the transistor comprises a bi-polar junction transistor.

22. The system of claim 12, wherein the transistor comprises a field-effect transistor is at least one selected from the group consisting of: a metal-oxide semiconductor field-effect transistor and a junction gate field-effect transistor.

* * * * *